United States Patent [19]
Yang

[11] Patent Number: 5,523,246
[45] Date of Patent: Jun. 4, 1996

[54] METHOD OF FABRICATING A HIGH-VOLTAGE METAL-GATE CMOS DEVICE

[75] Inventor: Sheng-Hsing Yang, Hsinchu, Taiwan

[73] Assignee: United Microelectronics Corporation, Hsinchu, Taiwan

[21] Appl. No.: 490,221

[22] Filed: Jun. 14, 1995

[51] Int. Cl.⁶ .................................................. H01L 21/265
[52] U.S. Cl. ................................ 437/34; 437/44; 437/56; 437/57; 437/58; 437/29; 148/DIG. 82
[58] Field of Search ................................ 437/57, 34, 44, 437/56, 58, 29; 148/DIG. 82

[56] References Cited

U.S. PATENT DOCUMENTS

| | | | |
|---|---|---|---|
| 4,851,257 | 7/1989 | Young et al. | 437/56 |
| 5,075,242 | 12/1991 | Nakahara | 437/34 |
| 5,342,794 | 8/1994 | Wei | 437/44 |
| 5,439,834 | 8/1995 | Chen | 437/58 |

FOREIGN PATENT DOCUMENTS

| | | | |
|---|---|---|---|
| 5324280 | 3/1978 | Japan | 437/34 |
| 1133365 | 5/1989 | Japan | 437/34 |
| 2122648 | 5/1990 | Japan | 437/34 |
| 471236 | 3/1992 | Japan | 437/34 |

*Primary Examiner*—George Fourson
*Assistant Examiner*—Long Pham
*Attorney, Agent, or Firm*—Townsend and Townsend and Crew

[57] ABSTRACT

A method of fabricating a high-voltage metal-gate CMOS device is disclosed. First, a semiconductor substrate of a first conductivity type having a well region of a second conductivity type is provided. Next, a barrier layer is formed and patterned to form openings for prospective source/drain regions. Then, through the openings, low concentrations of impurities of the first conductivity type and the second conductivity type are implanted into the well region and the semiconductor substrate, respectively. After performing a first thermal treatment, lightly doped source/drain regions of the first conductivity type and the second conductivity type are formed respectively, wherein an oxide layer is also formed within the openings. A sidewall spacer is formed on the sidewalls of the openings. Then, through the openings, high concentrations of impurities of the first conductivity type and the second conductivity type are implanted into the lightly doped source/drain regions of the first conductivity type and the second conductivity type, respectively. After removing the sidewall spacer performing a second thermal treatment, heavily doped source/drain regions of the first conductivity type and the second conductivity type are formed respectively. Further, the barrier layer is patterned to expose areas of the semiconductor substrate and the well region for the prospective gate electrode. Finally, a gate oxide layer and a metal gate electrode are formed.

5 Claims, 5 Drawing Sheets

METHOD OF FABRICATING A HIGH-VOLTAGE METAL-GATE CMOS DEVICE

BACKGROUND OF THE INVENTION

1. Field of the Invention

This invention relates in general to the fabrication of integrated circuit (IC) devices, and more particularly to a method of fabricating a high-voltage metal-gate CMOS device having heavily doped source and drain regions that are precisely formed within the lightly doped source and drain regions, so as to guarantee the uniformity of device characteristics.

2. Description of the Prior Art

Under current technology of fabricating high-voltage CMOS devices, a polysilicon layer is normally used as the gate electrode of a CMOS device. The polysilicon gate electrode configuration, however, requires a relatively long manufacturing cycle time. Thus the manufacturing cost is raised by such a long cycle time. Furthermore, due to their inherent characteristics, CMOS devices with polysilicon gate electrodes usually encounter a latch-up problem which is fatal to the operation of the devices.

By replacing the polysilicon gate electrode with a metal gate electrode, the cycle time of manufacturing a high-voltage CMOS device can be reduced and the latch-up problem can be prevented. However, the conventional process for fabricating a high-voltage metal-gate CMOS device suffers from poor dimensional alignment and symmetry for the fabricated source/drain regions that are prerequisites for the uniformity of the electrical characteristics for these CMOS devices fabricated. These poor alignment and symmetry characteristics found in the conventional fabrication processes are inherent to the nature of the fabrication process steps employed. Poor alignment in the source and drain regions of the CMOS device result in variations of the electrical characteristics for CMOS devices produced in different production batches, as the fabrication process conditions may vary for the alignments involved in the process steps.

SUMMARY OF THE INVENTION

It is therefore an object of the present invention to provide a process for fabricating high-voltage CMOS devices having a metal gate electrode to reduce the manufacturing cycle time and prevent latch-up.

It is yet another object of the present invention to provide a process for fabricating high-voltage CMOS devices with their heavily doped source and drain regions precisely formed within the lightly doped source and drain regions in a self-aligned manner, ensuring uniformity of device characteristics.

The present invention achieves the above-identified objects by providing a method of fabricating a high-voltage metal-gate CMOS device. First, a semiconductor substrate of a first conductivity type having a well region of a second conductivity type is provided. Next, a barrier layer is formed overlying the semiconductor substrate and the well region. The barrier layer is etched to form openings exposing portions of the semiconductor substrate and the well region for prospective source/drain regions. Then, through the openings, low concentrations of impurities of the first conductivity type and the second conductivity type are implanted into the well region and the semiconductor substrate, respectively. After performing a first thermal treatment to drive-in the low concentration of impurities, lightly doped source/drain regions of the first conductivity type and lightly doped source/drain regions of the second conductivity type are formed respectively, wherein an oxide layer is also formed within the openings by the first thermal treatment. A sidewall spacer is formed on the sidewalls of the openings. Then, through the openings, high concentrations of impurities of the first conductivity type and the second conductivity type are implanted into the lightly doped source/drain regions of the first conductivity type and the lightly doped source/drain regions of the second conductivity type, respectively. After removing the sidewall spacer and performing a second thermal treatment to drive-in the high concentration of impurities, heavily doped source/drain regions of the first conductivity type and heavily doped source/drain regions of the second conductivity type are formed respectively, wherein the thickness of the oxide layer is increased. Further, the barrier layer is patterned to expose areas of the semiconductor substrate and the well region for the prospective gate electrode. A gate oxide layer is formed on the areas for the prospective gate electrode. The oxide layer is then etched to form contact openings. Finally, a metal gate electrode is formed on the gate oxide layer.

BRIEF DESCRIPTION OF THE DRAWINGS

Other objects, features and advantages of the present invention will become apparent by way of the following detailed description of the preferred but non-limiting embodiment. The description is made with reference to the accompanying drawings, wherein.

DESCRIPTION OF THE PREFERRED EMBODIMENT

Figure 1A:
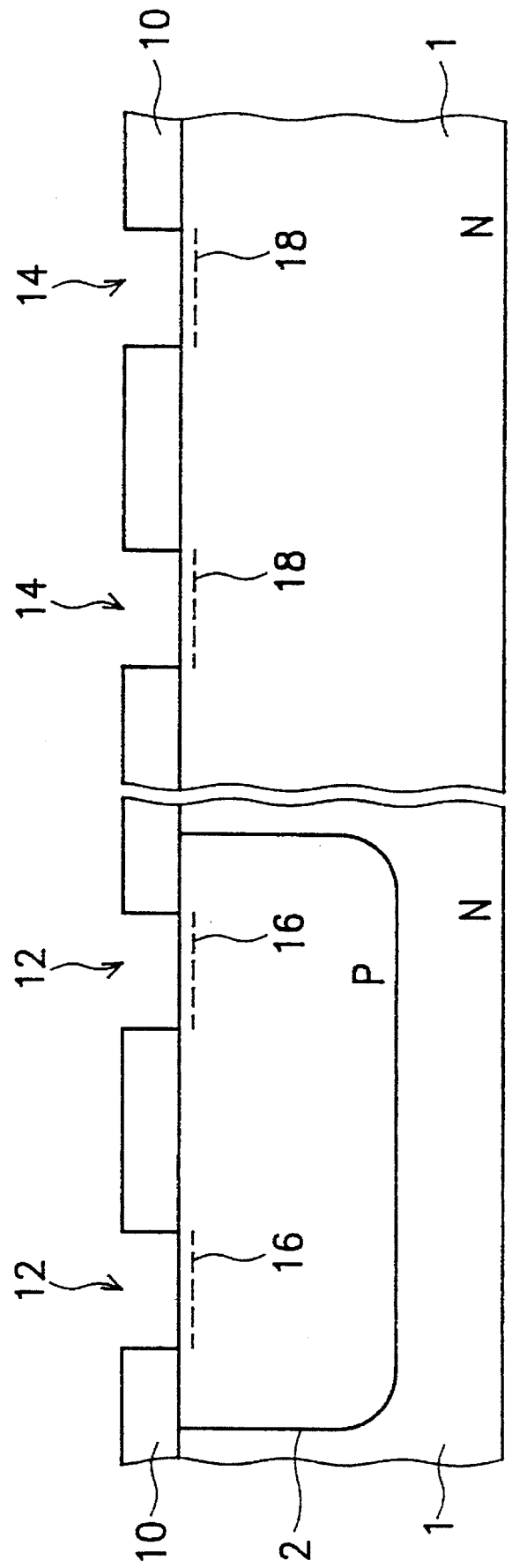
FIGS. 1a to 1e, respectively, show schematically cross-sectional views of the high-voltage metal-gate CMOS devices fabricated in the process in accordance with a preferred embodiment of the present invention as depicted in selected process stages, wherein the left hand side shows an NMOS transistor and the right hand side shows a PMOS transistor.
Figure 1B:
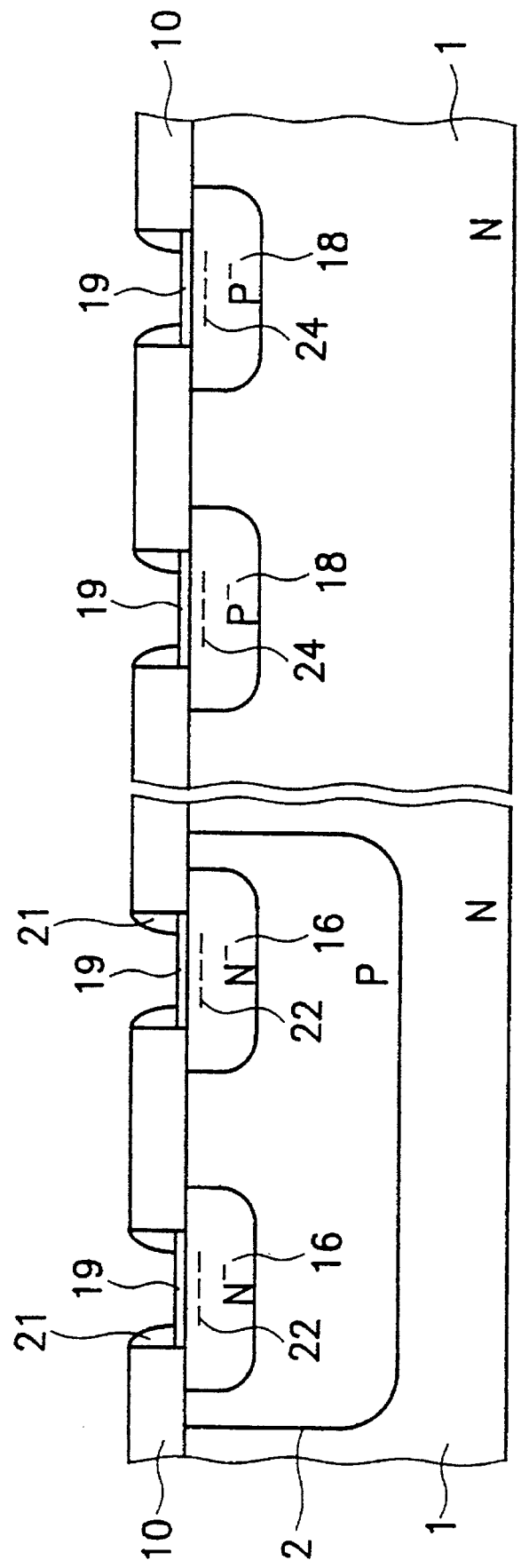

A preferred embodiment of the process in accordance with the present invention for fabricating a high-voltage metal-gate CMOS device with precision alignment and dimensional symmetry is described below by referring to FIGS. 1a to 1e. As persons skilled in the art may well appreciate, the process of the present invention may be applicable to a semiconductor substrate of a first conductivity type with a well region of a second conductivity type (e.g. a P-type substrate with an N-type well region or an N-type substrate with a P-type well region), although it is an N-type substrate 1 employed for the description. When the inventive process is described, the steps for fabricating both the NMOS and PMOS transistors of the CMOS device configuration are simultaneously exemplified. Since the NMOS and PMOS transistors that constitute the complementary pair are fabricated on the same substrate, if an N-type substrate 1 is employed, as in the case of the exemplified embodiment depicted in the drawings, then for the NMOS transistor, a P-well 2 will have to be prepared by a conventional implanting process. On the other hand, no corresponding N-well is required for the PMOS transistor. Stage 1

As is shown in FIG. 1a, a barrier layer 10 is formed on the semiconductor substrate 1 of the first conductivity type with a well region 2 of the second conductivity type. For example, an oxide layer 10 is formed by thermal oxidation on an N-type substrate 1 with a P-type well region 2. The barrier layer 10 is patterned by conventional lithography and etching processes to form openings 12 and 14 which expose portions of the semiconductor substrate 1 and the well region 2 for prospective source/drain regions. Then, through the openings 12 and 14 respectively, low concentrations of impurities of the first conductivity type are implanted into the position 16 of the well region 2 and impurities of the second conductivity type are implanted into the position 18 of the semiconductor substrate 1. For example, N-type impurities such as phosphoric ions are first implanted into the P-type well region 2. Then, P-type impurities such as boron ions are implanted into the N-type substrate 1.

Stage 2

Next, referring to FIG. 2b, a first thermal treatment is performed to drive-in the implanted low concentration of impurities. Therefore, $N^-$ lightly doped source/drain regions 16 and $P^-$ lightly doped source/drain regions 18 are formed in the P-type well region 2 and the N-type substrate 1, respectively. Meanwhile, an oxide layer 19 is also formed within the openings 12 and 14. Subsequently, a sidewall spacer 21 is formed on the sidewalls of the openings 12 and 14. For example, an oxide layer is first formed by chemical vapor deposition (CVD). That oxide layer is then etched back by reactive ion etching (RIE) to form the sidewall spacer 21. After that, through the openings 12 and 14 having the sidewall spacer 21, high concentrations of impurities of the first conductivity type and the second conductivity type are implanted into the lightly doped source/drain regions 16 and 18 respectively. For example, N-type impurities such as arsenic ions are first implanted into the position 22 of the $N^-$ lightly doped source/drain regions 16. Then, P-type impurities such as boron ions are implanted into the position 24 of the $P^-$ lightly doped source/drain regions 18.

Stage 3

Figure 1C:
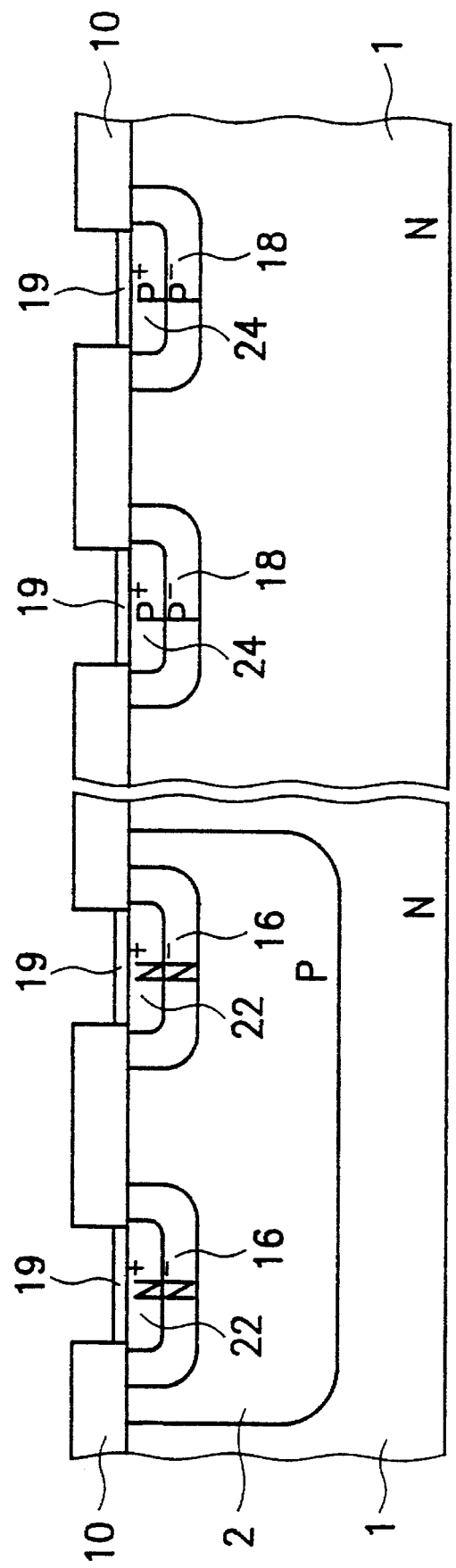

Then, as is shown in FIG. 1c, the sidewall spacer 21 is removed by a conventional etching process. A second thermal treatment is performed to drive-in the implanted high concentration of impurities. Therefore, $N^+$ heavily doped source/drain regions 22 and $P^+$ heavily doped source/drain regions 24 are formed in the $N^-$ lightly doped source/drain regions 16 and the $P^-$ lightly doped source/drain regions 18, respectively. Meanwhile, the thickness of the oxide layer 19 is increased due to the second thermal treatment.

Stage 4

Figure 1D:
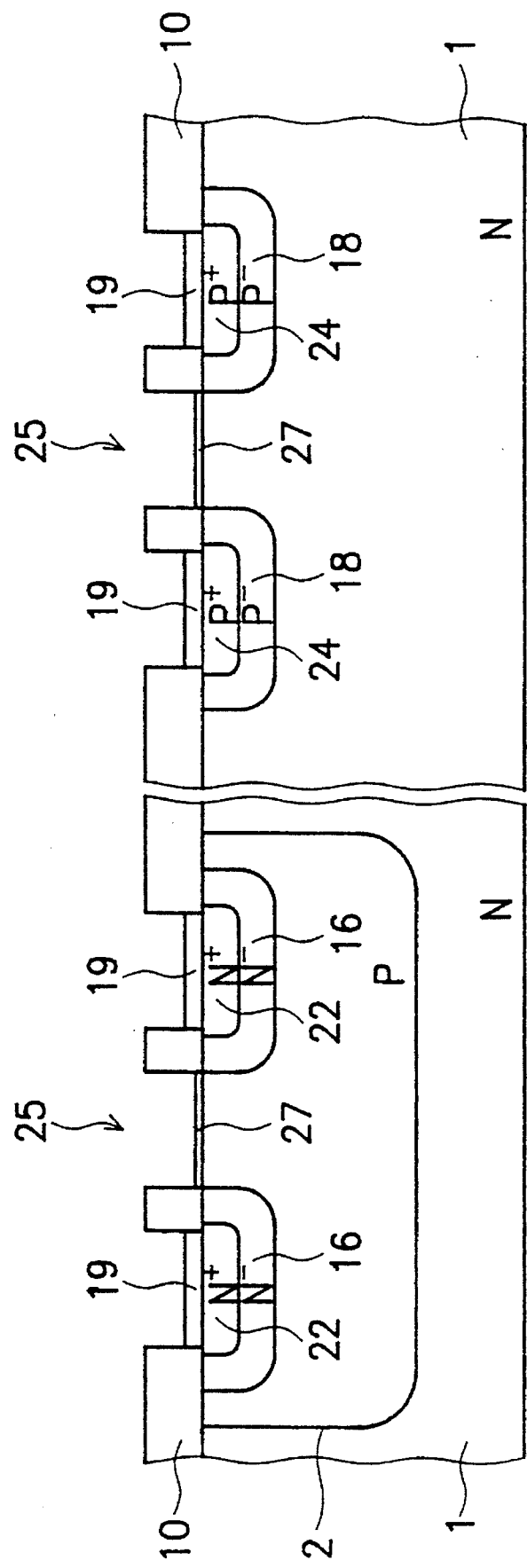

Referring next to FIG. 1d, the barrier layer 10 is patterned by lithography and etching processes to form openings 25 exposing areas of the semiconductor substrate 1 and the well region 2 for the prospective gate electrode. Next, a gate oxide layer 27 with a thickness of between 200 Å to 1000 Å is formed within the openings 25 by thermal oxidation or CVD. Again, the thickness of the oxide layer 19 is increased.

Stage 5

Figure 1E:
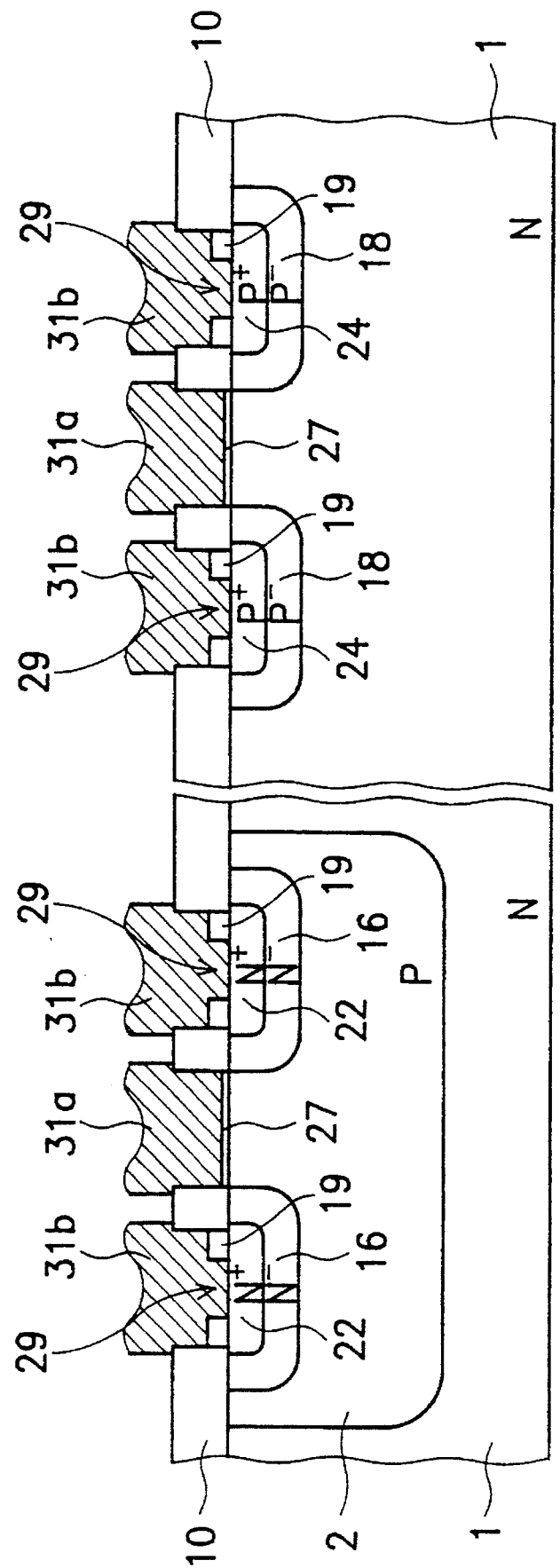

As is shown in FIG. 1e, the oxide layer 19 is patterned by lithography and etching processes to form contact openings 29 exposing the heavily doped source/drain regions 22 and 24. A metal layer, such as an aluminum layer, is sputtered on the surface of substrate. The metal layer is then patterned by etching to form a metal gate electrode 31a and metal lines 31b, wherein the metal gate electrode 31a is over the gate oxide layer 27. The metal lines 31b are connected to the heavily doped source/drain regions 22 and 24 through the contact openings 29. This generally concludes the fabrication of the high-voltage metal-gate CMOS device comprising the NMOS and PMOS transistor pair on an N-type substrate with a P-type well region.

As is appreciable after reading the above description of the fabrication process in accordance with the exemplified preferred embodiment, persons skilled in the art may acknowledge the advantages inherent to the process of metal-gate CMOS device fabrication as disclosed by the present invention. Since the implantation of the lightly doped source/drain regions 16 and 18 are guided by the openings 12 and 14 formed on the barrier layer 10, and the implantation of the heavily doped source/drain regions 22 and 24 are guided by the sidewall spacer 21 formed on the sidewalls of the openings 12 and 14, the precise alignment of the heavily doped source/drain regions 22 and 24 within the lightly doped source/drain regions 16 and 18 can be achieved. This results in the improvement of the uniformity of the electrical characteristics of the CMOS device. Moreover, the manufacturing cycle time can be reduced since the metal gate electrode 31a and the metal lines 31b are formed in a single patterning step.

The above-described preferred embodiment of the present invention is utilized only for the purpose of the description of the present invention. Persons skilled in this art can appreciate the fact that other similar arrangements can be devised from the embodiment disclosed above without departing from the spirit of the present invention, which is recited in the following claims.

What is claimed is:

1. A method of fabricating a high-voltage metal-gate CMOS device, comprising the steps of:

providing a semiconductor substrate of a first conductivity type having a well region of a second conductivity type;

forming a barrier layer overlying said semiconductor substrate and said well region, and etching said barrier layer to form openings exposing portions of said semiconductor substrate and said well region for prospective source/drain regions;

selectively implanting, through said openings, low concentrations of impurities of the first conductivity type into said well region of the second conductivity type and impurities of the second conductivity type into said semiconductor substrate of the first conductivity type;

performing a first thermal treatment to drive-in said low concentrations of impurities to form lightly doped source/drain regions of the first conductivity type and lightly doped source/drain regions of the second conductivity type respectively, wherein an oxide layer is also formed within said openings by said first thermal treatment;

forming a sidewall spacer on the sidewalls of said openings;

selectively implanting, through said openings, high concentrations of impurities of the first conductivity type into said lightly doped source/drain regions of the first conductivity type and impurities of the second conductivity type into said lightly doped source/drain regions of the second conductivity type;

removing said sidewall spacer;

performing a second thermal treatment to drive-in said high concentrations of impurities to form heavily doped source/drain regions of the first conductivity type and heavily doped source/drain regions of the second conductivity type respectively, wherein the thickness of said oxide layer is increased;

patterning said barrier layer to expose areas of said semiconductor substrate and said well region for the prospective gate electrode;

forming a gate oxide layer on said areas for the prospective gate electrode;

etching said oxide layer to form contact openings; and forming a metal gate electrode on said gate oxide layer and forming metal lines connecting to said source/drain regions through said contact openings.

2. The method of claim 1, wherein said first conductivity type is N type and said second conductivity type is P type.

3. The method of claim 1, wherein said first conductivity type is P type and said second conductivity type is N type.

4. The method of claim 1, wherein said barrier layer is a silicon dioxide layer.

5. The method of claim 1, wherein said sidewall spacer is a silicon nitride layer.

\* \* \* \* \*